United States Patent
Kim et al.

(10) Patent No.: US 10,168,781 B2
(45) Date of Patent: Jan. 1, 2019

(54) TOUCH SENSITIVE DEVICE AND DISPLAY DEVICE INCLUDING THE SAME

(71) Applicant: LG Display Co., Ltd., Seoul (KR)

(72) Inventors: Taeheon Kim, Seoul (KR); Yong-Su Ham, Seoul (KR); YongWoo Lee, Goyang-si (KR); YuSeon Kho, Seoul (KR); MyungJin Lim, Goyang-si (KR); Seulgi Choi, Incheon (KR)

(73) Assignee: LG DISPLAY CO., LTD., Seoul (KR)

( * ) Notice: Subject to any disclaimer, the term of this patent is extended or adjusted under 35 U.S.C. 154(b) by 190 days.

(21) Appl. No.: 15/392,401

(22) Filed: Dec. 28, 2016

(65) Prior Publication Data

US 2017/0192509 A1 Jul. 6, 2017

(30) Foreign Application Priority Data

Dec. 31, 2015 (KR) .......................... 10-2015-0191658

(51) Int. Cl.
| | |
|---|---|
| *G06F 3/01* | (2006.01) |
| *G06F 3/041* | (2006.01) |
| *H01L 41/22* | (2013.01) |
| *H01L 27/32* | (2006.01) |

(Continued)

(52) U.S. Cl.
CPC ............ *G06F 3/016* (2013.01); *B32B 27/304* (2013.01); *G06F 3/041* (2013.01); *G06F 3/0412* (2013.01); *G06F 3/0416* (2013.01); *H01L 27/323* (2013.01); *H01L 41/22* (2013.01); *B32B 2307/20* (2013.01); *B32B 2307/418* (2013.01);

(Continued)

(58) Field of Classification Search
CPC .. G10K 2210/3229; G10K 2210/32291; B06B 2201/55; B06B 2201/56; B06B 1/0688; H03K 2217/96062; A63F 2300/1037; G06F 3/016; B32B 2307/418; B32B 2307/20; H01L 41/22; H01L 41/27; H01L 41/277; H01L 41/29; H01L 41/293
See application file for complete search history.

(56) References Cited

U.S. PATENT DOCUMENTS

| | | | |
|---|---|---|---|
| 2012/0086651 A1* | 4/2012 | Kwon ..................... | G06F 3/016 345/173 |
| 2012/0128960 A1* | 5/2012 | Busgen .................... | F15D 1/12 428/220 |
| 2012/0139393 A1 | 6/2012 | Choi et al. | |

(Continued)

FOREIGN PATENT DOCUMENTS

| | | |
|---|---|---|
| KR | 10-2011-0071521 A | 6/2011 |
| KR | 10-2012-0063318 A | 6/2012 |
| WO | 2015/186771 A1 | 12/2015 |

*Primary Examiner* — Priyank J Shah
(74) *Attorney, Agent, or Firm* — Dentons US LLP

(57) ABSTRACT

Provided are a touch sensitive device and a display device including the same. The touch sensitive device includes: a first electroactive layer formed of a ferroelectric polymer; a plurality of electrodes disposed on at least one surface of the first electroactive layer; and a second electroactive layer in contact with the plurality of electrodes and the first electroactive layer and formed of an electroactive polymer. A coating layer having a low refractive index and formed of an electroactive polymer is formed on the first electroactive layer formed of a ferroelectric polymer having a low light transmittance, and, thus, a vibration level and a light transmittance of the touch sensitive device can be improved simultaneously.

18 Claims, 6 Drawing Sheets

(51) Int. Cl.
*B32B 27/30* (2006.01)
*G02F 1/1333* (2006.01)

(52) U.S. Cl.
CPC .... *B32B 2457/208* (2013.01); *G02F 1/13338* (2013.01)

(56) References Cited

U.S. PATENT DOCUMENTS

| | | |
|---|---|---|
| 2014/0307179 A1 | 10/2014 | Zhao et al. |
| 2016/0179260 A1* | 6/2016 | Ham .................... G06F 3/0412 345/173 |
| 2016/0188119 A1* | 6/2016 | Ham .................... H01L 41/1132 345/175 |
| 2016/0190428 A1* | 6/2016 | Lim ..................... G06F 1/1652 310/317 |
| 2016/0291729 A1* | 10/2016 | Schardt ................. G06F 3/016 |
| 2017/0192560 A1* | 7/2017 | Ham .................... G06F 3/0412 |
| 2018/0120941 A1* | 5/2018 | Choi ................. G02F 1/133365 |
| 2018/0148546 A1* | 5/2018 | Kim ...................... C08G 79/08 |
| 2018/0150138 A1* | 5/2018 | Kim ...................... G06F 3/016 |
| 2018/0150151 A1* | 5/2018 | Kho ..................... C09D 127/16 |
| 2018/0157325 A1* | 6/2018 | Kho ...................... G06F 3/016 |

\* cited by examiner

TOUCH SENSITIVE DEVICE AND DISPLAY DEVICE INCLUDING THE SAME

CROSS-REFERENCE TO RELATED APPLICATIONS

This application claims priority from Korean Patent Application No. 10-2015-0191658 filed on Dec. 31, 2015, the disclosure of which is incorporated by reference in its entirety, as if fully set forth herein.

BACKGROUND

Technical Field

The present disclosure relates to a touch sensitive device and a display device including the same, including a touch sensitive device with improved vibration level and light transmittance and a display device including the same.

Description of the Related Art

There has been an increased interest recently in touch type display devices, in which users can input information by touching the display device, because users want to use various display devices, such as a liquid crystal display device and an organic light emitting display device, easily. Accordingly, research into utilizing haptic devices has increased to provide direct and various touch feedbacks to the users. Conventional haptic devices are attached to the back of the display panel, and thus, it is difficult to provide an immediate and accurate feedback to a user's touch. Accordingly, research is being actively conducted to provide sensitive, varied and direct feedbacks to a user's touch by positioning the haptic device on an upper surface of the display panel.

Conventionally, a vibratory motor, such as an eccentric rotating mass (ERM) or a linear resonant actuator (LRA), has been used as a haptic device in a display device. The vibratory motor is designed so that the whole display device vibrates, and thus, such a massive vibratory motor is required in such a device to increase vibration intensity. The vibratory motor also has other disadvantages, in that it is difficult to modulate the frequency required to control the degree of vibration, thereby significantly increasing the response time.

In order to solve the problems described above, a shape memory alloy (SMA) and an electroactive ceramics (EAC) have been developed as suitable materials for haptic devices. However, a shape memory alloy (SMA) has a long response time, a short lifespan and is opaque, and electroactive ceramics (EAC) have low durability against an external impact, and are thus, fragile. Further, like the eccentric rotating mass and the linear resonant actuator, an electroactive ceramic actuator is opaque and it is difficult to manufactured a slim device.

SUMMARY

An exemplary objective of the present disclosure is to provide a touch sensitive device with an enhanced level of vibration that can be driven by a low driving voltage, and a display device including the same.

Another exemplary objective of the present disclosure is to provide a touch sensitive device which can be disposed on an upper surface of a display panel, toward which a light emitted from the display panel is directed, due to its improved light transmittance, and a display device including the same.

The present disclosure is not limited to the aforementioned exemplary objectives, and other objectives, which are not mentioned above, will be apparent to a person having ordinary skill in the art from the following description.

An exemplary embodiment of the present disclosure is a touch sensitive device comprising: a first electroactive layer comprising a ferroelectric polymer; a plurality of electrodes on at least one surface of the first electroactive layer; and a second electroactive layer in contact with the plurality of electrodes and the first electroactive layer and comprising an electroactive polymer.

In another exemplary aspect, the second electroactive layer is disposed on an upper surface and a lower surface of the first electroactive layer and covers the plurality of electrodes and the first electroactive layer.

In another exemplary aspect, the first electroactive layer is a stretched PVDF (poly vinylidenefluoride)-based polymer.

In another exemplary aspect, the PVDF-based polymer is a PVDF homopolymer.

In another exemplary aspect, the second electroactive layer has a lower refractive index than the plurality of electrodes.

In another exemplary aspect, the refractive index $n_3$ of the second electroactive layer satisfies the following Equation 3:

$$\sqrt{n_1} \leq n_3 \leq \sqrt{\frac{n_0 \times n_2^2}{n_1}}, \qquad (3)$$

where $n_0$ is the refractive index of air, $n_1$ is the refractive index of the first electroactive layer, and $n_2$ is the refractive index of the plurality of electrodes.

In another exemplary aspect, the electroactive polymer has a relative permittivity of 10.0 or more measured at 1 kHz.

In another exemplary aspect, the electroactive polymer is a PVDF copolymer or a PVDF terpolymer.

In another exemplary aspect, the PVDF copolymer is a copolymer of a VDF (vinylidenefluoride) monomer and one monomer selected from the group consisting of TrFE (trifluoroethylene), CTFE (chlorotrifluoroethylene), TFE (tetrafluoroethylene), CFE (chlorofluoroethylene), HFP (hexafluoropropene), and PMVE (Perfluoromethylvinylether), and the PVDF terpolymer is a terpolymer of a VDF monomer and two monomers selected from the group consisting of TrFE, TFE, CFE, CTFE, HFP, and PMVE.

In another exemplary aspect, the VDF monomer in the PVDF copolymer or the PVDF terpolymer is copolymerized in an amount of 50 mol % to 90 mol %.

In another exemplary aspect, the second electroactive layer has a thickness of 10 μm to 30 μm.

In another exemplary aspect, the material of the plurality of electrodes comprises a transparent conductive material.

Another exemplary embodiment of the present disclosure provides a touch sensitive device, wherein the plurality of electrodes includes: a plurality of first electrodes and a plurality of second electrodes alternately disposed on an upper surface of the first electroactive layer; and a plurality of third electrodes and a plurality of fourth electrodes alternately disposed on a lower surface of the first electroactive layer, wherein each of the first electrodes, the second electrodes, the third electrodes, and the fourth electrodes is electrically disconnected from each other.

In another exemplary aspect, the third electrodes are disposed to face the first electrodes, and the fourth electrodes are disposed to face the second electrodes, and a first voltage is applied to the first electrodes and the fourth electrodes and a second voltage is applied to the second electrodes and the third electrodes and wherein the second voltage is different from the first voltage.

Another exemplary embodiment of the present disclosure provides a display device comprising: a display panel; and a touch sensitive device disposed on a surface of the display panel, wherein the touch sensitive device includes a first electroactive layer comprising a ferroelectric polymer, a plurality of electrodes disposed on at least one surface of the first electroactive layer, and a second electroactive layer in contact with the plurality of electrodes and the first electroactive layer and comprising an electroactive polymer.

In another exemplary aspect, the display device further comprises: an add-on type touch panel disposed on the display panel, wherein the touch sensitive device is disposed between the display panel and the touch panel.

In another exemplary aspect, the display device further comprises: a backlight unit disposed under the liquid crystal display panel, and wherein the display panel is a liquid crystal display panel including a touch sensor configured to be integrated within the panel, and the touch sensitive device is disposed between the liquid crystal display panel and the backlight unit.

In another exemplary aspect, the display panel is an organic light emitting display panel.

Details of other exemplary embodiments will be included in the detailed description of the invention and the accompanying drawings.

The touch sensitive device of the present disclosure has enhanced vibration levels, and, thus, it is possible to deliver a stronger haptic feedback to a user, and reduce the driving voltage of the touch sensitive device.

Furthermore, according to the present disclosure, the light transmittance of the touch sensitive device is improved, and, thus, it is possible to minimize image quality deterioration in a display panel, which may occur when the touch sensitive device is disposed on the display panel.

The effects of the present disclosure are not limited to the aforementioned effects, and various other effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
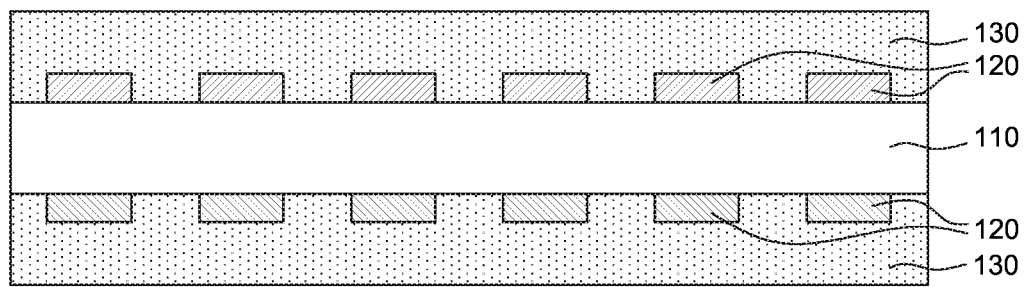
FIG. 1 is a schematic cross-sectional view of a touch sensitive device according to an exemplary embodiment of the present disclosure.

Advantages and features of the present disclosure, and methods for accomplishing the same will be more clearly understood from the exemplary embodiments described below with reference to the accompanying drawings. However, the present disclosure is not limited to the following exemplary embodiments and may be implemented in various different forms. The exemplary embodiments are provided only to complete disclosure of the present disclosure and to fully provide a person having ordinary skill in the art to which the present disclosure pertains with the category of the disclosure, and the inventive scope of the present disclosure will be defined by the appended claims and any combinations thereof.

Shapes, sizes, ratios, angles, numbers, and the like, illustrated in the accompanying drawings for describing the exemplary embodiments of the present disclosure are merely exemplary, and the present disclosure is not limited thereto. Like reference numerals generally denote like elements throughout the present disclosure. In the following description, a detailed explanation of known related technologies may be omitted to avoid unnecessarily obscuring the subject matter of the present disclosure. Terms such as "including," "having," and "consisting of" used herein are generally intended to allow other components to be added unless the terms are used in conjunction with the term "only". Any references to the singular may include the plural unless expressly stated otherwise.

Components are interpreted to include an ordinary error range even if not expressly stated.

When the positional relation between two parts is described using the terms such as "on", "above", "below", and "next", one or more parts may be positioned between the two parts unless the terms are used in conjunction with the term "immediately" or "directly".

When an element or layer is referred to as being "on" another element or layer, it may be directly on the other element or layer, or intervening elements or layers may be present unless the term is used in conjunction with the term "immediately" or "directly".

Although the terms "first", "second", and the like, are used for describing various components, these components are not confined by these terms. These terms are merely used for distinguishing one component from the other components, and a first component may be a second component in a technical concept of the present disclosure.

The size and thickness of each component illustrated in the drawings are represented for convenience of explanation, and are not necessarily to scale.

The features of various embodiments of the present disclosure can be partially or entirely bonded to or combined with each other and can be interlocked and operated in technically various ways, and the embodiments can be carried out independently of, or in association with, each other.

In the present disclosure, the term "touch sensitive device" refers to a device that can deliver a haptic feedback to a user in response to the user's touch on the touch sensitive device.

Hereinafter, various exemplary embodiments of the present disclosure will be described in detail with reference to the accompanying drawings.

FIG. 1 is a schematic cross-sectional view of a touch sensitive device according to an exemplary embodiment of the present disclosure. As illustrated in FIG. 1, a touch sensitive device 100 includes a first electroactive layer 110, a plurality of electrodes 120, and a second electroactive layer 130.

The first electroactive layer 110 is a layer which can be deformed by a voltage applied thereto to generate vibrations, and may be formed of a ferroelectric polymer. The ferroelectric polymer is an electroactive polymer (EAP) which can be deformed by electrical stimulation. The ferroelectric polymer may be a PVDF-based polymer, which includes a PVDF repeating unit in a main chain of the polymer. Examples of the PVDF-based polymer include a PVDF homopolymer or a PVDF copolymer.

Generally, ferroelectric polymers and dielectric elastomers have been used as electroactive polymers for an electroactive layer. A dielectric elastomer, which may include a silicon-based polymer, a urethane-based polymer, or an acryl-based polymer, has a lower relative permittivity than the ferroelectric polymer and thus requires a high driving voltage. Therefore, it is difficult to apply the dielectric elastomer to a display device, such as a mobile electronic device, driven with a relatively low voltage. On the other hand, a ferroelectric polymer has a higher relative permittivity than a dielectric elastomer, and thus, has a higher vibration level at a low voltage.

The first electroactive layer 110 may be a ferroelectric polymer film. In such a case, the ferroelectric polymer film may be formed using a co-extrusion process or a solution process, but the present disclosure is not limited thereto.

A thickness of the first electroactive layer 110 may be determined such that the touch sensitive device 100 can generate vibrations of sufficient magnitude at a low driving voltage. For example, the thickness of the first electroactive layer 110 may be from 10 μm to 200 μm. If the thickness of the first electroactive layer 110 satisfies the above-described range, the first electroactive layer 110 can generate vibrations of sufficient magnitude, thereby reducingthe driving voltage. This is because if the thickness of the first electroactive layer 110 is greater than 200 μm, an excessive driving voltage may be required to drive the touch sensitive device 100.

The first electroactive layer 110 may have varied refractive indexes depending on the kind of ferroelectric polymer included therein. For example, if the first electroactive layer 110 is formed of a PVDF homopolymer, the first electroactive layer 110 may have a refractive index of about 1.45.

The plurality of electrodes 120 apply an electric field to the first electroactive layer 110 and the second electroactive layer 130 to induce vibrations or bending by electrical stimulation. In the touch sensitive device 100 illustrated in FIG. 1, the plurality of electrodes are disposed on an upper surface and a lower surface of the first electroactive layer 110, but the present disclosure is not limited thereto.

The plurality of electrodes 120 are formed of a conductive material. Further, in order to secure light transmittance of the touch sensitive device 100, the plurality of electrodes 120 may be formed of a transparent conductive material. For example, the plurality of electrodes 120 may be formed of a transparent conductive material such as indium tin oxide (ITO), indium zinc oxide (IZO), graphene, metal nanowire, and a transparent conductive oxide (TCO). Further, the plurality of electrodes 120 may be formed as a metal mesh, in which a metal material is formed into a mesh, such that the plurality of electrodes 120 are substantially transparent. However, a material of the plurality of electrodes 120 is not limited to the above-described examples, and various transparent conductive materials may be used. Each individual electrode of the plurality of electrodes 120 may be formed of the same material or different materials from each other.

The plurality of electrodes 120 may have varied refractive indexes depending on a material thereof. For example, if the plurality of electrodes 120 is formed of ITO or IZO, the plurality of electrodes 120 may have a refractive index of from 1.8 to 2.0.

The plurality of electrodes 120 generally have higher refractive indices than a PVDF-based polymer, because the plurality of electrodes 120 are formed of a conductive material. Therefore, the plurality of electrodes 120 may be disposed on the first electroactive layer 110 so as to increase reflectivity and reduce light transmittance of the touch sensitive device 100.

The plurality of electrodes 120 may be formed on the first electroactive layer 110 in various ways, for e.g., by a sputtering, printing, and slit coating method.

The plurality of electrodes 120 may be disposed in various forms as necessary. For example, the plurality of electrodes 120 may be disposed on each of the upper surface and the lower surface of the first electroactive layer 110. In this case, the electrodes disposed on the upper surface of the first electroactive layer 110 are extended in an X-axis direction and the electrodes disposed on the lower surface of the first electroactive layer 110 are extended in a Y-axis direction so as to have a vertical alignment structure in which they are disposed to intersect with each other in a matrix. Further, the plurality of electrodes 120 may have a horizontal alignment structure in which the electrodes 120 are disposed on only one surface of the first electroactive layer 110. Furthermore, the plurality of electrodes 120 may have a multilayer structure in which the plurality of electrodes 120 are disposed on each of the upper surface and the lower surface of the first electroactive layer 110 so as to face each other in one cell, thereby implementing both the vertical alignment structure and the horizontal alignment structure.

The touch sensitive device 100 illustrated in FIG. 1 includes a plurality of upper electrodes on the upper surface of the first electroactive layer 110 and a plurality of lower electrodes on the lower surface of the first electroactive layer 110. In this configuration, various electric fields can be generated by applying various combinations of voltages to each of the electrodes. Therefore, the touch sensitive device 100 can be driven in various ways and can also vibrate in a partially independent manner thereby delivering a variety of sensations directly to a user. The plurality of electrodes 120 generate an electric field in response to a voltage applied from the outside. In order to generate an electric field in the first electroactive layer 110, voltages having different levels or voltages having opposite electric properties may be applied to the plurality of electrodes 120.

If voltages having different electric properties are applied to the upper electrodes and the lower electrodes of the first electroactive layer 110, an electric field is generated in a longitudinal direction, and the first electroactive layer 110 may be deformed or vibrated by the electric field. Further, if the plurality of voltages 120 are disposed on the same surface and voltages having different electric properties are applied to adjacent electrodes, an electric field is generated in a transverse direction. The second electroactive layer 130 and the first electroactive layer 110 may be deformed or vibrated by the electric field generated in the transverse direction.

As illustrated in FIG. 1, the plurality of electrodes 120 in the touch sensitive device 100A are disposed on each of the upper and lower surfaces of the first electroactive layer 110 so as to face each other. In this arrangement, both the vertical alignment structure and the horizontal alignment structure of the electrodes can be implemented. Detailed explanation thereof will follow with reference to FIG. 2.

The second electroactive layer 130 is formed on the first electroactive layer 110 on which the plurality of electrodes 120 are disposed. The second electroactive layer 130 is disposed to be in contact with the plurality of electrodes 120 and the first electroactive layer 110. Thus, the second electroactive layer 130 is disposed on the plurality of electrodes 120 and also disposed on the first electroactive layer 110 on which the plurality of electrodes 120 is not disposed. The second electroactive layer 130 improves the vibration level and light transmittance.

The second electroactive layer 130 is disposed on the first electroactive layer 110, and functions as a secondary electroactive layer that vibrates by electrical stimulation together with the first electroactive layer 110. Thus, the second electroactive layer 130 is vibrated or deformed by an electric field generated by the plurality of electrodes 120. The second electroactive layer 130 is formed of an electroactive polymer.

If different voltages are applied to the plurality of electrodes 120, the first electroactive layer 110 may be deformed and vibrated by the electric field in the vertical direction, and the second electroactive layer 130 may be deformed and vibrated by the electric field in the horizontal direction. Thus, the touch sensitive device 100 has a higher vibration level and a lower driving voltage than a conventional touch sensitive device, which does not include a second electroactive layer. A description of a method for driving the second electroactive layer 130 will follow with reference to FIG. 2.

In the touch sensitive device 100, the second electroactive layer 130 also improves light transmittance of the touch sensitive device 100 by functioning as a refractive index matching layer.

Generally, the ferroelectric polymer constituting the first electroactive layer 110 has an excellent relative permittivity, and thus, has an excellent vibration level at a low voltage. However, the optical properties of the dielectric elastomer, including light transmittance, are superior to those of the ferroelectric polymer.

The touch sensitive device may be preferably disposed to be adjacent to the user's touch position to deliver a more direct sense of touch to a user. Therefore, the touch sensitive device may be preferably disposed on an upper surface of a display panel. However, as described above, the ferroelectric polymer has a lower light transmittance than the dielectric elastomer. Thus, if the touch sensitive device is disposed on the upper surface of the display panel, the efficiency decrease and an image quality of the display device may deteriorate.

Particularly, a decrease in light transmittance may be a problem for the PVDF homopolymer. The PVDF homopolymer may not have a high relative permittivity just by a solution casting method, because the PVDF homopolymer has an α-phase structure. The α-phase structure refers to a structure in which fluoro groups (—F) are disposed in a state with a mixture of trans- and gauche-conformations along a main chain of a polymer. Therefore, in the α-phase, the PVDF homopolymer has a low intensity of polarization.

Further, the total intensity of polarization in the α-phase is offset and a relative permittivity becomes very low because the fluoro groups are disposed to face each other within a crystal lattice. Therefore, in order to secure a desirable relative permittivity of the PVDF homopolymer, an elongation process and a polling process need to be performed after formation of the PVDF homopolymer film. If the PVDF homopolymer film is stretched, the main chain is extended, reducing the steric hindrance between fluoro groups connected to carbon atoms. Thus, a space for β-phase in which all of fluoro groups are in trans-conformation can be secured. Then, the polling process of applying a high DC voltage to the stretched film formed of the PVDF homopolymer to align the negatively charged fluoro groups in one direction is performed. The fluoro groups without steric hindrance are aligned in the same direction within a crystal lattice, to maximize the polarization intensity. As a result, the stretched PVDF homopolymer is changed from the α-phase structure to the β-phase structure.

However, if the PVDF homopolymer film is stretched, the roughness of the film increases, thereby decreases light transmittance and increasing haze. Therefore, an electroactive layer formed of the stretched PVDF homopolymer film has a lower light transmittance than the dielectric elastomer.

Further, as described above, the plurality of electrodes 120 of the touch sensitive device 100 formed of a material such as ITO has a refractive index of 1.8 to 2.0, and the first electroactive layer 110 formed of a PVDF-based polymer has a refractive index of about 1.45. Thus, the touch sensitive device 100 has a structure in which a plurality of layers having different refractive indexes are laminated, and when a light passes through an interface between two layers, a part of the light is reflected. As a difference in refractive indexes between the two layers in contact with each other increases, the amount of light reflected at the interface also increases. Therefore, if a material having an appropriate refractive index is coated on the first electroactive layer 110 and the plurality of electrodes 120, a difference in refractive index between air and the first electroactive layer 110 or between air and the plurality of electrodes 120 can be reduced, thereby reducing the aforementioned reflection and improving light transmittance. For example, if the second electroactive layer 130 has a lower refractive index than the plurality of electrodes 120, the overall refractive index decreases and light transmittance increases compared with a case where the second electroactive layer 130 is not used.

Particularly, a refractive index of the second electroactive layer 130 is set such that light reflected from the second electroactive layer 130, light reflected from the plurality of electrodes 120, and light reflected from the first electroactive layer 110 can destructively interfere with each other, thereby minimizing the reflectivity of the touch sensitive device 100.

As illustrated in FIG. 1, a three-layer area where the plurality of electrodes 120 and the second electroactive layer 130 are disposed on the first electroactive layer 110 and a two-layer area where only the second electroactive layer 130 is disposed on the first electroactive layer 110 exists in the touch sensitive device 100. In the two-layer area where the second electroactive layer 130 is disposed directly on the first electroactive layer 110 without the plurality of electrodes 120, the reflectivity may be minimized when the refractive index $n_3$ of the second electroactive layer 130 satisfies the following Equation 1, where $n_1$ is the refractive index of the first electroactive layer 110:

$$n_3 = \sqrt{n_1} \quad \text{[Equation 1]}$$

Further, in the three-layer area where plurality of electrodes 120 and the second electroactive layer 130 are disposed on the first electroactive layer 110, reflectivity may be minimized when the refractive index $n_3$ of the second electroactive layer 130 satisfies the following Equation 2, where $n_0$ is a refractive index of air, $n_1$ is a refractive index of the first electroactive layer 110, $n_2$ is a refractive index of the plurality of electrodes 120:

$$n_3 = \sqrt{\frac{n_0 \times n_2^2}{n_1}} \quad \text{[Equation 2]}$$

In the touch sensitive device 100, a plurality of electrodes 120 having various shapes and sizes may be disposed on the first electroactive layer 110. In some cases, the first electroactive layer 110 may be configured to be entirely covered by the electrodes. Otherwise, as illustrated in FIG. 1, the plurality of electrodes 120 may be disposed at a predetermined distance from each other on the first electroactive layer 110. That is, the touch sensitive device 100 may include both the two-layer area where the second electroactive layer 130 is disposed directly on the first electroactive layer 110 and the three-layer area where the first electroactive layer 110, the plurality of electrodes 120, and the second electroactive layer 130 are laminated in sequence. Considering the positional relationship between the first electroactive layer 110 and the plurality of electrodes 120 in the touch sensitive device 100, it is desirable for the refractive index of the second electroactive layer 130 to satisfy the following Equation 3.

$$\sqrt{n_1} \le n_3 \le \sqrt{\frac{n_0 \times n_2^2}{n_1}} \quad \text{[Equation 3]}$$

Meanwhile, the electroactive polymer constituting the second electroactive layer 130 may preferably be a compound having a high relative permittivity and appropriate refractive index to produce a larger deformation at a low driving voltage, thereby improving light transmittance of the touch sensitive device 100.

For example, the electroactive polymer constituting the second electroactive layer 130 may have a relative permittivity of 10.0 or more at 1 kHz. If the electroactive polymer has a relative permittivity of 10.0 or more, the second electroactive layer 130 may generate a sufficiently high level of vibrations with the first electroactive layer 110 by an electric field generated between the electrodes formed on one surface of the first electroactive polymer.

The electroactive polymer constituting the second electroactive layer 130 may be a PVDF copolymer or a PVDF terpolymer. This is because the PVDF copolymer or the PVDF terpolymer has a refractive index similar to that of the ferroelectric polymer constituting the first electroactive layer 110 and has an excellent relative permittivity or piezoelectric property. The PVDF copolymer has a relative permittivity of from about 10 to about 16 and the PVDF terpolymer has a relative permittivity of from about 15 to about 30. Thus, the PVDF copolymer or the PVDF terpolymer can improve the vinrational level of the touch sensitive device 100.

The PVDF copolymer is a copolymer including a VDF (vinylidenefluoride) monomer, and the PVDF terpolymer is a terpolymer including a VDF monomer. The other monomer copolymerized with the VDF monomer may include one or more selected from the group consisting of TrFE (trifluoroethylene), CTFE (chlorotrifluoroethylene), TFE (tetrafluoroethylene), CFE (chlorofluoroethylene), HFP (hexafluoropropene), and PMVE (perfluoromethylvinylether), but is not limited thereto. For example, the PVDF copolymer or the PVDF terpolymer may be selected from the group consisting of P(VDF-CTFE), P(VDF-CFE), P(VDF-HFP), P(VDF-CDFE), P(VDF-TrFE-CTFE), P(VDF-TrFE-CFE), P(VDF-TrFE-HFP), P(VDF-TrFE-CDFE), P(VDF-TFE-CTFE), P(VDF-TFE-CFE), P(VDF-TFE-HFP), and P(VDF-TFE-CDFE).

Herein, the VDF monomer in the PVDF copolymer or the PVDF terpolymer may be copolymerized in an amount of 50 mol % to 90 mol %, and it is desirable for the VDF monomer and the other monomer to be copolymerized at a molar ratio of 5:5 to 9:1. If the amount of VDF providing a dielectric property to the polymer satisfies the above-described range, the second electroactive layer 130 may be stably formed on the first electroactive layer 110 and may remarkably improve the vibration acceleration of the touch sensitive device 100.

The second electroactive layer 130 may be formed by coating an electroactive layer on the first electroactive layer 110 on which the plurality of electrodes 120 is disposed. Although not illustrated in FIG. 1, if a plurality of electrodes is disposed only on one surface of the electroactive layer, the second electroactive layer may be formed not only on the one surface on which the plurality of electrodes is disposed but also on the other surface on which the plurality of electrodes is not disposed.

The second electroactive layer 130 may have a thickness of 10 μm to 30 μm. The thickness of the second electroactive layer 130 is a thickness measured from the surface of the first electroactive layer 110 on which the second electroactive layer 130 is disposed. If the thickness of the second electroactive layer 130 satisfies the above-described range, it is possible to reduce a driving voltage without decreasing the light transmittance.

Figure 2:
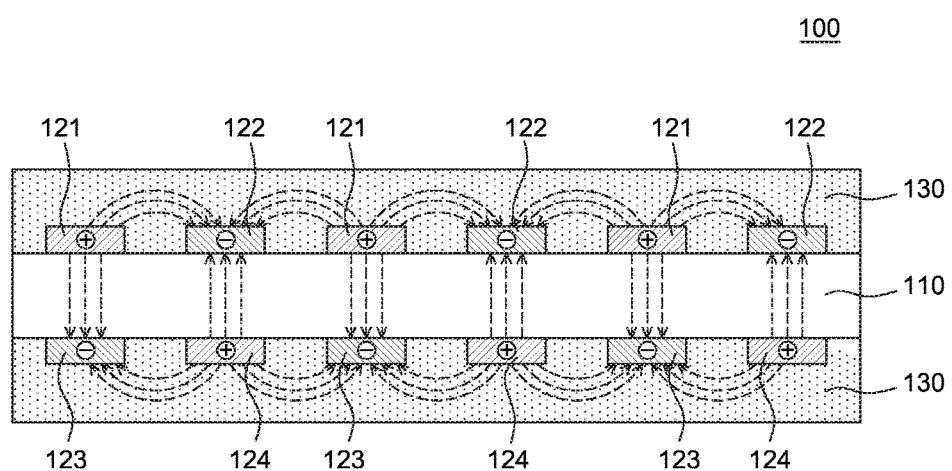
FIG. 2 is a schematic cross-sectional view illustrating a method for driving a touch sensitive device according to an exemplary embodiment of the present disclosure.

FIG. 2 is a schematic cross-sectional view illustrating a method for driving a touch sensitive device according to an exemplary embodiment of the present disclosure. The touch sensitive device illustrated in FIG. 2 is substantially the same as the touch sensitive device 100 illustrated in FIG. 1, and redundant descriptions thereof will be omitted.

As illustrated in FIG. 2, a plurality of first electrodes 121 and a plurality of second electrodes 122 are disposed on an a top surface the first electroactive layer 110, and a plurality of third electrodes 123 and a plurality of fourth electrodes 124 are disposed on a bottom surface of the first electroactive layer 110. Different voltages are applied to adjacent electrodes, as well as to electrodes facing each other. For example, a first voltage may be applied to the first electrodes 121 and the fourth electrodes 124, and a second voltage may be applied to the second electrodes 122 and the third electrodes 123, but the present disclosure is not limited thereto. For example, the first voltage may be an AC voltage having a predetermined frequency and the second voltage may be a ground voltage, or the first voltage may be a ground voltage and the second voltage may be an AC voltage. The touch sensitive device 100 may deliver various haptic feedbacks to a user depending on a frequency of the first voltage and the second voltage. FIG. 2 illustrates the touch sensitive device 100 at a moment when the first voltage is a certain positive voltage and the second voltage is a certain negative voltage.

The electric field generated is indicated by a dotted arrow in FIG. 2. An electric field is generated in a longitudinal direction between the first electrodes 121 disposed on the upper surface of the first electroactive layer 110 and the third electrodes 123 disposed on the lower surface of the first electroactive layer 110, and an electric field is generated in the longitudinal direction between the second electrodes 122 disposed on the upper surface and the fourth electrodes 124 disposed on the lower surface. The first electroactive layer 110 formed of a ferroelectric polymer is vibrated by the above-described electric fields generated in the longitudinal direction.

An electric field is generated in a transverse direction between the first electrodes 121 and the second electrodes 122 disposed on the upper surface of the first electroactive layer 110, and an electric field is generated in the transverse direction between the third electrodes 123 and the fourth electrodes 124 disposed on the lower surface of the first electroactive layer 110. The second electroactive layer 130 formed of an electroactive polymer is vibrated by the above-described electric fields generated in the transverse direction.

As described above, a transverse electric field and a longitudinal electric field are generated at the same time within the touch sensitive device 100. Therefore, it is possible to improve the vibration level and also reduce the driving voltage of the touch sensitive device 100.

In some exemplary embodiments, the first voltage may be selectively applied to the first electrodes 121 and the fourth electrodes 124. In other words, the first voltage may be applied to all of the first electrodes 121 and the fourth electrodes 124, or the first voltage may be applied to only one of the first electrodes 121 and the fourth electrodes 124. The size of an electric field generated when the first voltage is applied to only one of the first electrodes 121 and the fourth electrodes 124 is different from the size of an electric field generated when the first voltage is applied to all of the first electrodes 121 and the fourth electrodes 124. Thus, a voltage may be selectively applied to the first electrodes 121 and the fourth electrodes 124 to provide haptic feedbacks having various intensities to a user. Thus, the first voltage may be applied to all of the first electrodes 121 and the fourth electrodes 124 to provide a relatively strong haptic feedback to the user. Alternatively, the first voltage may be applied to only one of the first electrodes 121 and the fourth electrodes 124 to provide a relatively weak haptic feedback to the user.

As described above, the touch sensitive device 100 includes the second electroactive layer 130 including an electroactive polymer, thereby improving the intensity of vibration and reducing the driving voltage. If voltages having different electric properties are applied between the plurality of electrodes 120 disposed adjacent to each other on the same surface of the first electroactive layer 110, the second electroactive layer 130 is vibrated by an electric field generated in a transverse direction between the plurality of electrodes 120. Further, the second electroactive layer 130 has a lower refractive index than the plurality of electrodes 120. Thus, the reflectivity may be reduced and light transmittance may be improved. Accordingly, the touch sensitive device 100 can be disposed on the display panel to be adjacent to the user's touch position.

The exemplary embodiments of the present disclosure will be described in detail with reference to the following Examples.

EXAMPLE 1

A film of a PVDF homopolymer (refractive index: 1.48) was formed and then uniaxially stretched so as to form a first electroactive layer having a thickness of 80 μm. On an upper surface of the first electroactive layer, 8 ITO (refractive index: 1.91) upper electrodes were deposited at a distance of 0.5 mm from each other in an X-axis direction. On a lower surface of the first electroactive layer, 6 ITO (refractive index: 1.91) lower electrodes were deposited to a thickness of 200 nm at a distance of 0.5 mm from each other in a Y-axis direction. Then, a P(VDF-TrFE) polymer (refractive index: 1.45) (molar ratio of TrFE to VDF: 7:3) was dissolved in a DMF (dimethylformamide) solvent so as to prepare a coating composition of 15 wt. %. A coating layer was formed by performing bar-coating with the prepared coating composition on both surfaces of the first electroactive layer on which the ITO electrodes were formed and then drying at 80° C. for 10 minutes and at 110° C. for 10 minutes. As a result, a second electroactive layer was formed to a thickness of 20 μm. Then, a polling process was performed with 100 V per μm, to prepare a touch sensitive device.

EXAMPLE 2

A touch sensitive device was prepared by the same method as Example 1 except a molar ratio of the TrFE monomer to the VDF monomer in a P(VDF-TrFE) copolymer as a coating composition for forming a second electroactive layer was varied.

Comparative Example

A film of a PVDF homopolymer (refractive index: 1.48) was formed and then uniaxially stretched so as to form a first electroactive layer having a thickness of 80 μm. Then, ITO electrodes (refractive index: 1.91) having a thickness of 200 nm were deposited on both surfaces of the first electroactive layer. However, a second electroactive layer was not included in this touch sensitive device.

Experimental Example 1

Measurement of Vibration Acceleration

In the touch sensitive devices according to Example 1, Example 2, and Comparative Example, a vibration acceleration was measured when voltages of 100 V, 300 V, 500 V and 700 V were applied to the upper electrodes at 100 kHz and a ground voltage was applied to the lower electrodes. The results of these measurements are shown in the following Table 1.

TABLE 1

|  | Vibration acceleration (G) | | | |
| --- | --- | --- | --- | --- |
|  | 100 V applied | 300 V applied | 500 V applied | 700 V applied |
| Comparative Example | 0.12 | 0.26 | 0.37 | 0.43 |
| Example 1 | 0.21 | 0.37 | 0.55 | 0.76 |
| Example 2 | 0.18 | 0.35 | 0.47 | 0.64 |

As seen from Table 1, the touch sensitive devices of Examples 1 and 2 have far higher vibration accelerations at each voltage than the Comparative Example. Further, it can be seen that the touch sensitive devices of Examples 1 and 2 require remarkably lower driving voltages than the touch sensitive device of the Comparative Example on the basis of the same vibration acceleration. Specifically, in order to implement a vibration acceleration of about 0.37 G, a driving voltage of 500V needs to be applied to the touch sensitive device of the Comparative Example, whereas a driving voltage of about 300V needs to be applied to the touch sensitive devices of Examples 1 and 2. As a result, the touch sensitive devices of Examples 1 and 2 also consume less power.

Experimental Example 2

Measurement of Light Transmittance and Haze

Figure 3:
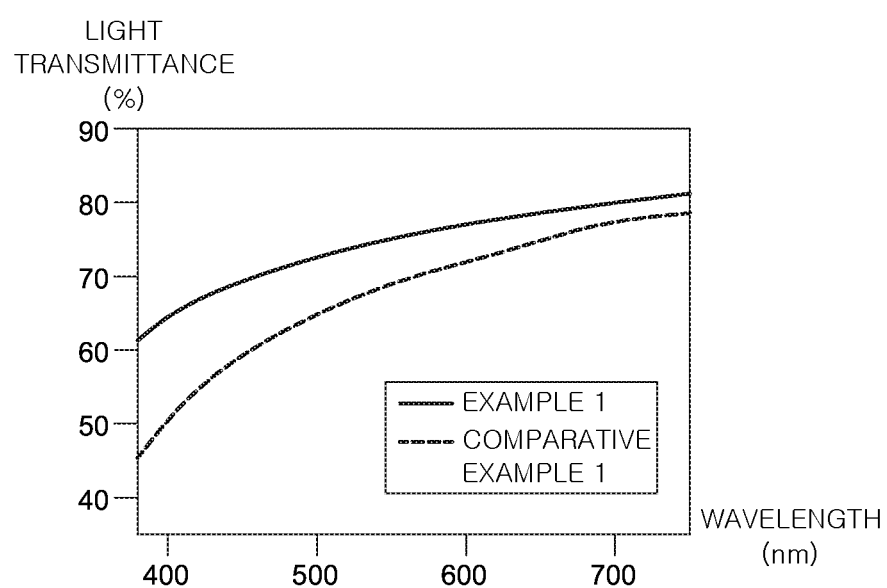
FIG. 3 is a graph of light transmittance as a function of wavelength of touch sensitive devices according to Example 1 and Comparative Example.
Figure 4:
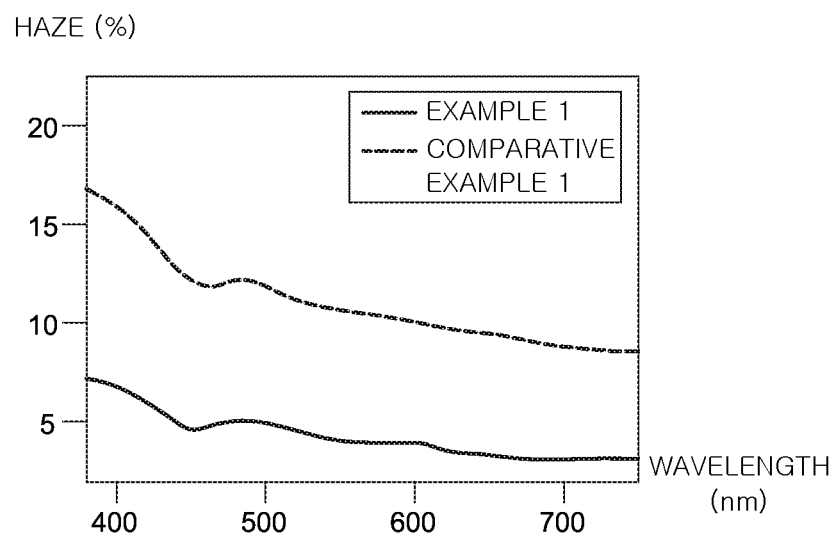
FIG. 4 is a graph of haze as a function of wavelength of the touch sensitive devices according to Example 1 and Comparative Example.

FIG. 3 is a graph of light transmittance of the touch sensitive devices of Example 1 and Comparative Example, and FIG. 4 is a graph of the haze of the touch sensitive devices of Example 1 and Comparative Example. The light transmittance and haze of the touch sensitive devices of Example 1 and Comparative Example were measured using a meter (JCH-300S, Ocean Optics, Inc.).

Referring to FIG. 3 and FIG. 4, the touch sensitive device of Example 1 has a higher light transmittance and significantly lower haze at a wavelength range of 400 nm to 750 nm than the touch sensitive device of the Comparative Example. Particularly, light transmittance of Example 1 at a wavelength of 675 nm was 77% compared to a 67% light transmittance of the Comparative Example. Thus, including a second electroactive layer formed of a PVDF copolymer having a refractive index of 1.45 increases the light transmittance by about 10%.

As described above, when a second electroactive layer formed of an electroactive polymer is disposed on the first electroactive layer formed of a ferroelectric polymer having a low light transmittance so as to be in contact with the electrodes and the first electroactive layer, the vibration level and light transmittance of the touch sensitive device can be improved simultaneously. Accordingly, the touch sensitive device using the ferroelectric polymer can be disposed on an upper surface of the display device, thereby minimizing deterioration of the image quality and providing vibrational feedback directly to a user.

Figure 5:
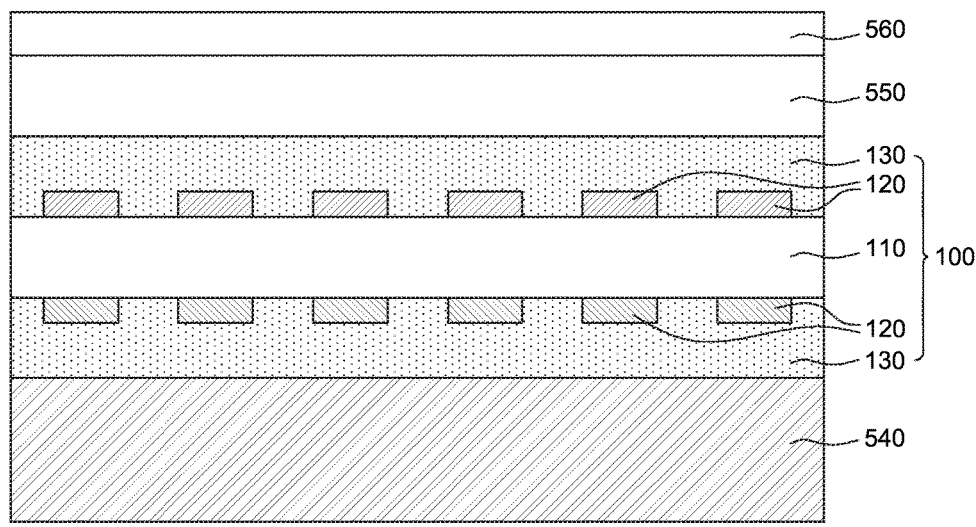
FIG. 5 is a schematic cross-sectional view of a display device including a touch sensitive device according to a first exemplary embodiment of the present disclosure.

FIG. 5 is a schematic cross-sectional view of a display device according to a first exemplary embodiment, and includes a touch sensitive device according to an exemplary embodiment of the present disclosure. As illustrated in FIG. 5, the display device 500 includes a display panel 540, the touch sensitive device 100, a touch panel 550, and a cover 560.

The display panel 540 is a panel on which a display component for displaying an image on the display device 500 is disposed. Various display panels, such as an organic light emitting display panel, a liquid crystal display panel, and an electrophoretic display, panel may be used as the display panel 540.

The touch sensitive device 100 including the first electroactive layer 110, the plurality of electrodes 120, and the second electroactive layer 130 is disposed on the display panel 540. In the following description of FIG. 5, the touch sensitive device 100 illustrated in FIG. 1 is included in the display device 500, and redundant descriptions thereof will be omitted. However, the present disclosure is not limited thereto.

The touch panel 550 is disposed on the touch sensitive device 100. The touch panel 550 is a panel configured to sense a user's touch input into the display device 500. For example, a capacitive touch panel, a resistive touch panel, an ultrasonic wave touch panel, and an infrared touch panel may be used as the touch panel 550. Preferably, a capacitive touch panel may be used as the touch panel 550. The display device 500 illustrated in FIG. 5 includes an add-on type touch panel in which the separately prepared touch panel 550 is disposed on the display panel 540.

The cover 560 is disposed on the touch panel 550, and protects the display device 500 against external impact. The cover 560 may be formed of a transparent insulating material.

Although not illustrated in FIG. 5, an adhesive layer for bonding the display panel 540, the touch sensitive device 100, the touch panel 550, and the cover 560 to each other may be used. The adhesive layer may includean OCA (optical clear adhesive) or an OCR (optical clear resin), but is not limited thereto.

Figure 6:
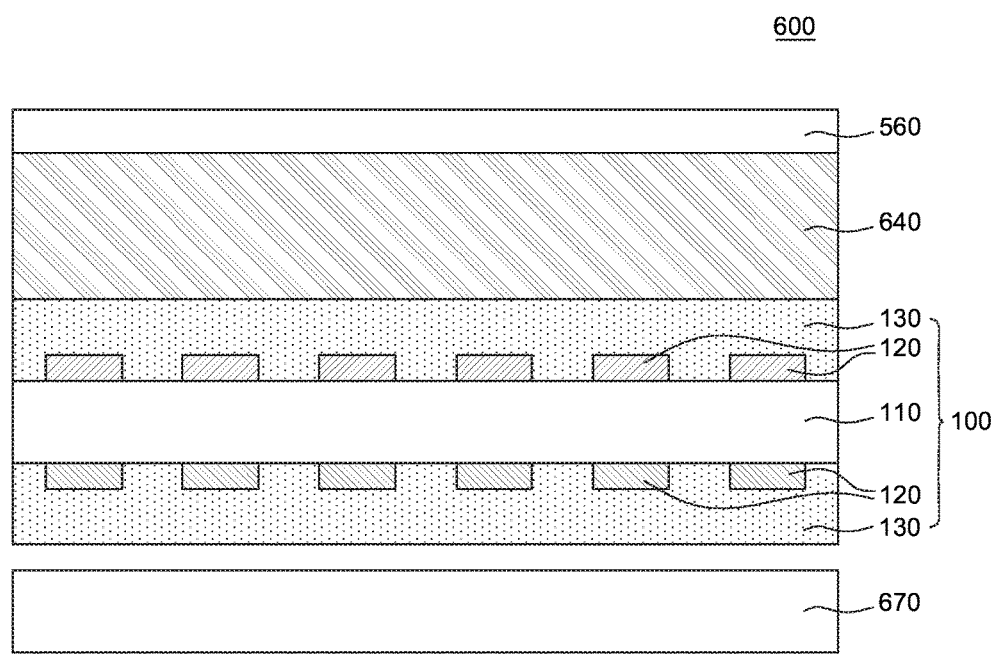
FIG. 6 is a schematic cross-sectional view of a display device including a touch sensitive device according to a second exemplary embodiment of the present disclosure.

FIG. 6 is a schematic cross-sectional view of a display device according to a second exemplary embodiment, and includes a touch sensitive device according to an exemplary embodiment of the present disclosure. The display device 600 illustrated in FIG. 6 is different from the display device 500 only in that the display panel 640 is a liquid crystal display panel and thus the display device 600 further includes a backlight unit 670 and an in-cell type touch sensor in which a touch sensor is integrated with the display panel 460 instead of a separate touch panel. However, the other components of the display device 600 are substantially the same as those of the display device 500, and redundant descriptions thereof will be omitted.

As illustrated in FIG. 6, the display panel 640 is disposed between the cover 560 and the touch sensitive device 100. The liquid crystal display panel displays an image by controlling the transmittance of light emitted from the backlight unit 670. The liquid crystal display panel includes a lower polarization plate, a lower substrate including a thin film transistor TFT, a liquid crystal layer, an upper substrate including a color filter, and an upper polarization plate, but is not limited thereto.

The display panel 640 includes the touch sensor which is a panel on which a display component for displaying an image on the display device 600 is disposed and which is integrated within the panel. That is, the touch sensor is an in-cell type touch sensor disposed within the display panel 640. In the in-cell type touch sensor, a common electrode of the display panel 640 is also used as a touch electrode.

The display device 600 illustrated in FIG. 6 is a liquid crystal display device. Thus, the backlight unit 670 configured to emit a light toward the display panel 640 is disposed under the display panel 640.

The touch sensitive device 100 including the first electroactive layer 110, the plurality of electrodes 120, and the second electroactive layer 130 is disposed between the display panel 640 and the backlight unit 670.

Generally, if a display panel is a liquid crystal display panel and an in-cell type touch sensor is integrated with the display panel, when a touch sensitive device is disposed on the touch sensor, a touch input may be misrecognized due to noise generated by a high driving voltage applied to the touch sensitive device. Thus, the touch sensitive device may be disposed under the display panel. However, if the touch sensitive device is disposed under the display panel, the touch sensitive device is farther away from a user's touch position, thereby reducing the level of vibrations delivered to the user. To increase the vibration level, a method of disposing the touch sensitive device between the liquid crystal display panel and a backlight unit may be considered. However, as described above, the touch sensitive device using a ferroelectric polymer having a low light transmittance may decrease the transmittance of light emitted from the backlight unit. To address this drawback, the second electroactive layer 130 disposed to cover the electrodes is used in the display device 600, thereby improving light transmittance of the touch sensitive device 100. Therefore, even if the touch sensitive device 100 is disposed between the liquid crystal display panel and the backlight unit, a light shielding rate for a light supplied from the backlight unit to the liquid crystal display panel can be minimized Although the exemplary embodiments of the present disclosure have been described in detail with reference to the accompanying drawings, the present disclosure is not limited thereto and may be embodied in many different forms without departing from the technical concept of the present disclosure. The exemplary embodiments of the present disclosure are provided for illustrative purposes only but not intended to limit the technical concept of the present disclosure. The protective scope of the present disclosure should be construed based on any appended claims and combinations thereof, and all technical concepts equivalent in scope thereof should be construed as falling within the scope of the present disclosure.

What is claimed is:

1. A touch sensitive device comprising:
a first electroactive layer comprising a ferroelectric polymer;
a plurality of electrodes on at least one surface of the first electroactive layer; and
a second electroactive layer in contact with the plurality of electrodes and the first electroactive layer and comprising an electroactive polymer.

2. The touch sensitive device according to claim 1, wherein the second electroactive layer is disposed on an upper surface and a lower surface of the first electroactive layer and covers the plurality of electrodes and the first electroactive layer.

3. The touch sensitive device according to claim 1, wherein the first electroactive layer is a stretched PVDF (poly vinylidenefluoride)-based polymer.

4. The touch sensitive device according to claim 3, wherein the PVDF-based polymer is a PVDF homopolymer.

5. The touch sensitive device according to claim 1, wherein the second electroactive layer has a lower refractive index than the plurality of electrodes.

6. The touch sensitive device according to claim 1, wherein a refractive index $n_3$ of the second electroactive layer satisfies the following Equation 3.

$$\sqrt{n_1} \le n_3 \le \sqrt{\frac{n_0 \times n_2^2}{n_1}} \quad \text{[Equation 3]}$$

wherein $n_0$ is a refractive index of air, $n_1$ is a refractive index of the first electroactive layer, and $n_2$ is a refractive index of the plurality of electrodes.

7. The touch sensitive device according to claim 1, wherein the electroactive polymer has a relative permittivity of 10.0 or more measured at 1 kHz.

8. The touch sensitive device according to claim 1, wherein the electroactive polymer is a PVDF copolymer or a PVDF terpolymer.

9. The touch sensitive device according to claim 8, wherein the PVDF copolymer is a copolymer of a VDF (vinylidenefluoride) monomer and one monomer selected from the group consisting of TrFE (trifluoroethylene), CTFE (chlorotrifluoroethylene), TFE (tetrafluoroethylene), CFE (chlorofluoroethylene), HFP (hexafluoropropene), and PMVE (Perfluoromethylvinylether), and
the PVDF terpolymer is a terpolymer of a VDF monomer and two monomers selected from the group consisting of TrFE, TFE, CFE, CTFE, HFP, and PMVE.

10. The touch sensitive device according to claim 9, wherein the VDF monomer in the PVDF copolymer or the PVDF terpolymer is copolymerized in an amount of 50 mol % to 90 mol %.

11. The touch sensitive device according to claim 1, wherein the second electroactive layer has a thickness of 10 μm to 30 μm.

12. The touch sensitive device according to claim 1, wherein a material of the plurality of electrodes comprises a transparent conductive material.

13. The touch sensitive device according to claim 1, wherein the plurality of electrodes includes:
a plurality of first electrodes and a plurality of second electrodes alternately disposed on an upper surface of the first electroactive layer; and
a plurality of third electrodes and a plurality of fourth electrodes alternately disposed on a lower surface of the first electroactive layer,
wherein each of the first electrodes, the second electrodes, the third electrodes, and the fourth electrodes is electrically disconnected from each other.

14. The touch sensitive device according to claim 13, wherein the third electrodes are disposed to face the first electrodes, and the fourth electrodes are disposed to face the second electrodes, and a first voltage is applied to the first electrodes and the fourth electrodes and a second voltage is applied to the second electrodes and the third electrodes and wherein the second voltage is different from the first voltage.

15. A display device comprising:
a display panel; and
a touch sensitive device on a surface of the display panel,
wherein the touch sensitive device includes a first electroactive layer comprising a ferroelectric polymer, a plurality of electrodes on at least one surface of the first electroactive layer, and a second electroactive layer in contact with the plurality of electrodes and the first electroactive layer and comprising an electroactive polymer.

16. The display device according to claim 15, further comprising:
an add-on type touch panel disposed on the display panel,
wherein the touch sensitive device is disposed between the display panel and the touch panel.

17. The display device according to claim 15, further comprising:
a backlight unit disposed under the liquid crystal display panel, and
wherein the display panel is a liquid crystal display panel including a touch sensor configured to be integrated within the panel, and the touch sensitive device is disposed between the liquid crystal display panel and the backlight unit.

18. The display device according to claim 15, wherein the display panel is an organic light emitting display panel.

* * * * *